US010892312B2

(12) United States Patent
Won

(10) Patent No.: US 10,892,312 B2
(45) Date of Patent: Jan. 12, 2021

(54) FLEXIBLE DISPLAY DEVICE

(71) Applicant: LG Display Co., Ltd., Seoul (KR)

(72) Inventor: Jooyeon Won, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/998,514

(22) Filed: Aug. 16, 2018

(65) Prior Publication Data

US 2019/0058028 A1 Feb. 21, 2019

(30) Foreign Application Priority Data

Aug. 16, 2017 (KR) .................. 10-2017-0103836

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/5253* (2013.01); *H01L 51/56* (2013.01); *H01L 23/544* (2013.01); *H01L 51/0097* (2013.01); *H01L 2223/5442* (2013.01); *H01L 2223/54426* (2013.01); *H01L 2223/54486* (2013.01);
(Continued)

(58) Field of Classification Search
CPC ............. H01L 27/1214; H01L 27/1251; H01L 27/3244–3297; H01L 29/4908; H01L 51/0508–0533; H01L 2924/13069; H01L 29/41733; H01L 29/42384; H01L 29/66265; H01L 29/66742–6675; H01L 29/7317; H01L 29/786
See application file for complete search history.

(56) References Cited

U.S. PATENT DOCUMENTS 5,951,304 A * 9/1999 Wildes ................. B81B 7/0006
174/261
2007/0275578 A1* 11/2007 Yamada ............... H05K 1/0269
439/79
(Continued)

FOREIGN PATENT DOCUMENTS

CN          1152721 A     6/1997
CN       101131800 A     2/2008
(Continued)

OTHER PUBLICATIONS

Chinese Office Action and Search Report dated Jul. 3, 2020 in a counterpart Chinese Application No. CN 201810908969.7 (9 pages) and translation (5 pages).

*Primary Examiner* — Cuong B Nguyen
(74) *Attorney, Agent, or Firm* — Polsinelli PC

(57) ABSTRACT

A flexible display device may include a flexible display panel including a display area disposed a plurality of pixels, a signal line area disposed a plurality of signal lines for transmitting driving signals to the plurality of pixels, and a panel pad area disposed a plurality of panel pads for receiving an external driving signal, and a flexible film configured to transmit the driving signals inputted from an external to the flexible display panel and including a film pad area in which a plurality of film pads arranged so as to correspond to the plurality of panel pad, wherein the plurality of film pads has a first thickness configured to increase a contact surface with the flexible display panel.

8 Claims, 9 Drawing Sheets

(51) Int. Cl.
*H01L 51/56* (2006.01)
*H01L 51/00* (2006.01)
*H01L 23/544* (2006.01)

(52) U.S. Cl.
CPC .............. *H01L 2227/323* (2013.01); *H01L 2251/5338* (2013.01); *H01L 2251/558* (2013.01)

(56) References Cited

U.S. PATENT DOCUMENTS

2013/0082987 A1* 4/2013 Kang .................. G02F 1/13452
345/204
2017/0127512 A1* 5/2017 Park ....................... H05K 1/118

FOREIGN PATENT DOCUMENTS

| CN | 104347678 A | 2/2015 |
| CN | 104752485 A | 7/2015 |
| CN | 105979696 A | 9/2016 |
| CN | 106652786 A | 5/2017 |

\* cited by examiner

FLEXIBLE DISPLAY DEVICE

CROSS REFERENCE TO RELATED APPLICATION

This application claims the priority of Republic of Korean Patent Application No. 10-2017-0103836 filed on Aug. 16, 2017, in the Korean Intellectual Property Office, the disclosure of which is incorporated herein by reference in its entirety.

BACKGROUND

Field of the Disclosure

The present disclosure relates to a display device, and more particularly, to a flexible display device including a flexible film bonded to a display panel.

Description of the Background

In recent years, a flexible display device, which can be manufactured by forming a display element, a line, and the like on a substrate made of a material having flexibility such as plastic and so on so that can display an image even when it is bent like paper. Accordingly, research and development thereof have actively been proceeding.

Such a flexible display device can be a flexible liquid crystal display device, a flexible plasma display device, a flexible electroluminescence light-emitting display device, a flexible electrophoretic display device, or a flexible electrowetting display device.

The flexible display device includes a display panel for displaying an image, a printed circuit board for driving the display panel, and a flexible film for electrically connecting the display panel and the printed circuit board.

Particularly, a method of mounting a data driver IC for supplying a data signal to data lines arranged on a display panel and a gate driver IC for supplying a gate signal to gate lines includes a method of mounting a driver IC on a flexible film or a method of directly mounting a driver IC on a substrate. Here, the method of mounting the driver IC on the flexible film is, for example, COF (Chip On Film) or TCP (Tape Carrier Package), and the method of mounting the driver IC directly onto the flexible substrate is COP (Chip On Plastic).

Due to the recent development of display technology, the display device becomes thinner and the resolution of the product has increased as the data is increased. As a result, the number of lines connected to the driver IC and the number of pads corresponding to each line have been increased. Inevitably, the bezel area became wide.

As described above, in order to minimize the problem in the enlarging bezel area in the flexible display device of high pixel resolution, it is necessary to narrow the pitches of the lines and the pads. As a result, the deformation of the pad occurs due to heat when bonding the display panel and the flexible film, and the reliability of the flexible display device is deteriorated.

SUMMARY

Accordingly, the inventors of the present disclosure have recognized that it is important to minimize the bezel of a flexible display device in order to provide a wider display area to the user as the pixel resolution of the flexible display device is improved and the thickness is reduced. Particularly, the inventors of the present disclosure have recognized that it is important to dispose a large number of lines and pads without enlarging a bezel area in a flexible display device in terms of high pixel resolution.

Further, the inventors of the present disclosure have recognized that a misalignment problem occurs by a misalignment between a pad disposed on a flexible display panel and another pad disposed on a flexible film due to a difference in thermal expansion ratio between the flexible display panel and the flexible film.

Accordingly, the inventors of the present disclosure have invented a flexible display device capable of minimizing the occurrence of misalignment in bonding between a flexible display panel and a flexible film while minimizing the size of a bezel in a flexible display device of high pixel resolution.

Accordingly, it is an object of the present disclosure to provide a flexible display device having a high pixel resolution capable of disposing a large number of pads without increasing a bezel area by improving the pitch between pads disposed in a pad area of a flexible display device.

The present disclosure is not limited to the above-mentioned features, and other advantages can be clearly understood by those skilled in the art from the following description.

A flexible display device according to an aspect of the present disclosure may include a flexible display panel. The flexible display panel may include a display area disposed a plurality of pixels, a signal line area disposed a plurality of signal lines for transmitting driving signals to the plurality of pixels, and a panel pad area disposed a plurality of panel pads for receiving the driving signals from an external, and a flexible film configured to transmit the driving signals inputted from an external to the flexible display panel and including a film pad area in which a plurality of film pads are arranged so as to correspond to the panel pad, wherein the plurality of film pads arranged on the flexible film has a first thickness configured to increase a contact surface with the flexible display panel. Accordingly, the flexible display device according to an aspect of the present disclosure can minimize misalignment between the flexible display panel and the flexible film, thereby providing a high-resolution flexible display device with improved reliability.

A flexible display device according to another aspect of the present disclosure may include a flexible display panel. The flexible display panel may include a display area disposed a plurality of pixels, a signal line area disposed a plurality of signal lines for transmitting driving signals to the plurality of pixels, and a panel pad area disposed a plurality of panel pads for receiving the driving signals from an external, and a flexible film configured to transmit the driving signals inputted from an external to the flexible display panel and including a film pad area in which a plurality of film pads arranged so as to correspond to the panel pad, wherein the plurality of panel pads of the flexible display panel and the plurality of film pads of the flexible film may be arranged in a fan shape, wherein the plurality of panel pads of the flexible display panel and the plurality of film pads of the flexible film may be arranged to correspond to each other, and wherein the plurality of panel pads of the flexible display panel and the plurality of film pads of the flexible film may be arranged so as to have different pitches and different slopes from each other.

Accordingly, a flexible display device according to another aspect of the present disclosure may include a plurality of panel pads of a flexible display panel and a plurality of film pads of a flexible film to have a fan shape.

Therefore, even when the plurality of panel pads and the plurality of film pads are different from each other in thermal expansion coefficient, the area where the plurality of panel pads and the plurality of film pads are overlapped can be enlarged. Accordingly, misalignment between the plurality of panel pads and the plurality of film pads can be minimized.

The details of other aspects are included in the detailed description and drawings.

According to the present disclosure, the plurality of pads arranged on the flexible film are disposed as thin as possible so that the upper surface of the plurality of pads arranged on the flexible film is widened to widen the contact surface with the plurality of pads arranged on the flexible substrate, thereby increasing the overlapping area between the film and the flexible film. Accordingly, it is possible to provide a flexible display device in which reliability is improved by minimizing misalignment between a plurality of pads disposed on a flexible film and a plurality of pads disposed on a flexible substrate.

According to the present disclosure, the flexible substrate and the plurality of pads disposed on the flexible film are disposed to correspond to each other. However, the pitches between the pads are arranged differently, and the pads are arranged so that they have different slopes. Accordingly, a large number of pads can be disposed while minimizing the size increase of the bezel, thereby providing a high-resolution flexible display device.

According to the present disclosure, by arranging a plurality of pads to have a fan shape in each of the flexible display panel and the flexible film, y-axis correction is possible when bonding between the flexible display panel and the flexible film. Therefore, the reliability of the electrical connection can be improved.

The effects according to the present disclosure are not limited by the contents exemplified above, and more various effects are included in the specification

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
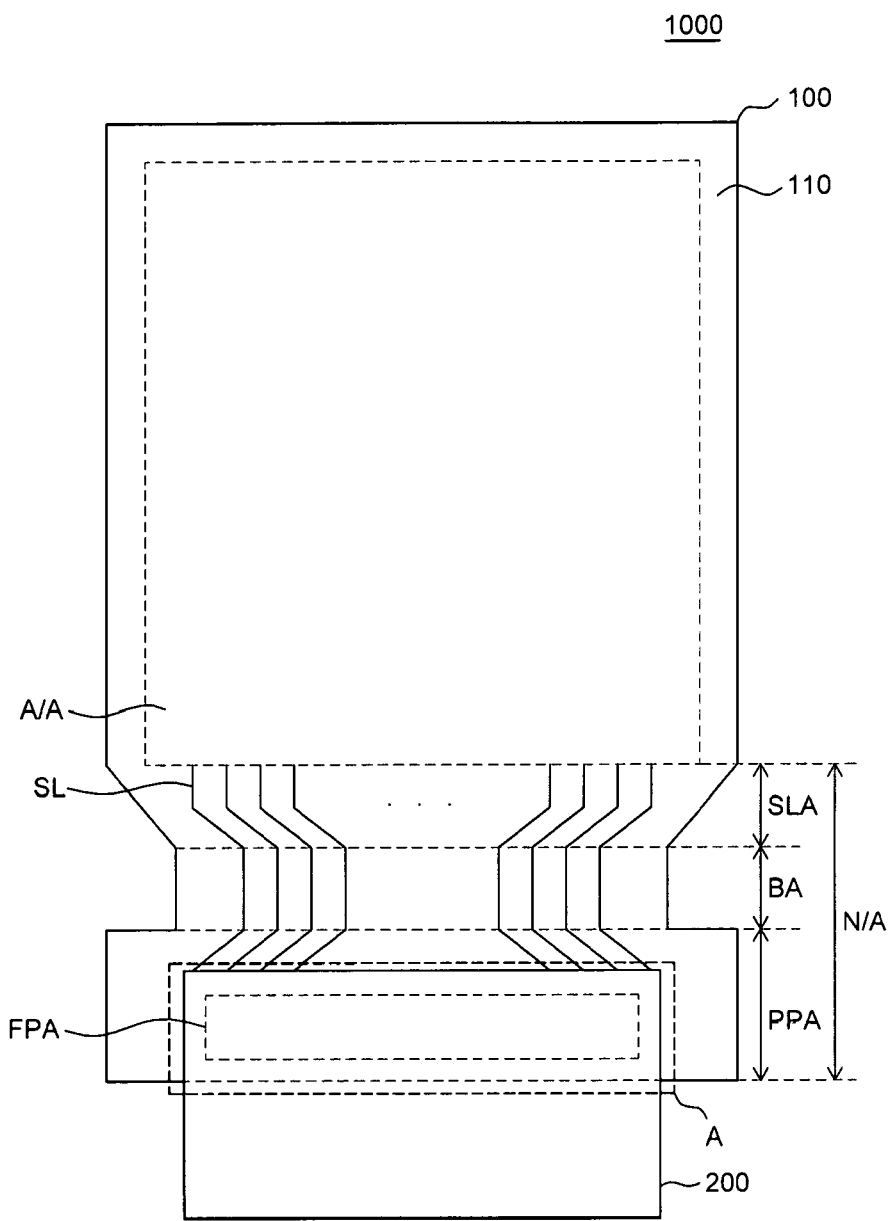
FIG. 1 is a plan view of a flexible display device according to an aspect of the present disclosure.

Advantages and characteristics of the present disclosure and a method of achieving the advantages and characteristics will be clear by referring to the aspects described below in detail together with the accompanying drawings. However, the present disclosure is not limited to the aspect disclosed herein but will be implemented in various forms. The aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". It is to be understood that an element or layer is referred to as being "on" another element or layer, including either intervening layers or other elements directly on or in between. When an element is described as being "connected," "coupled," or "connected" to another element, the element may be directly connected or connected to the other element. However, it should be understood that other elements may be "interposed" between each element, or each element may be "connected," "coupled," or "connected" through another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

The sizes and thicknesses of the individual components shown in the drawings are shown merely for convenience of explanation and the present disclosure is not necessarily limited to the size and thickness of the components shown in the drawings.

Each of the features of the various aspects of the present disclosure can be combined or combined with each other partly or entirely. The features of the various aspects can be technically interlocked and driven as well. The features of the various aspects can be practiced independently or in conjunction with each other independently of each other.

Hereinafter, various aspects of the present disclosure will be described in detail with reference to accompanying drawings.

Figure 2:
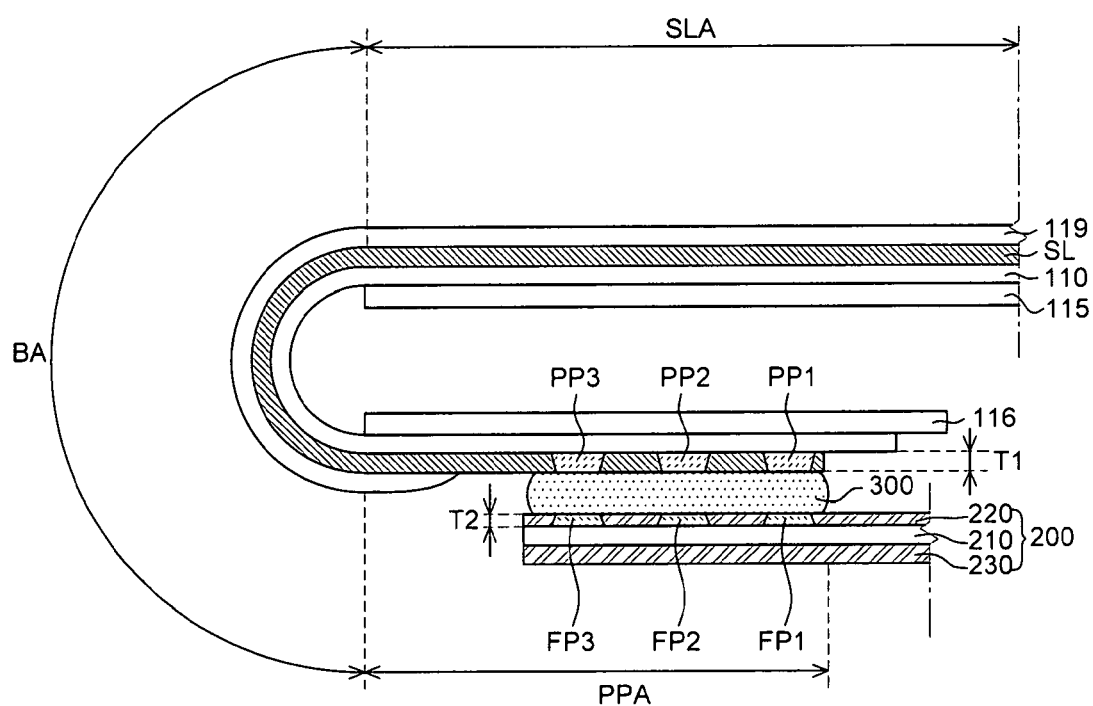
FIG. 2 is a cross-sectional view illustrating a non-display area of a flexible display device according to an aspect of the present disclosure.

FIG. 1 is a plan view of a flexible display device according to an aspect of the present disclosure. FIG. 2 is a cross-sectional view illustrating a non-display area of a flexible display device according to an aspect of the present disclosure.

Referring to FIGS. 1 and 2, a flexible display device 1000 according to an aspect of the present disclosure may include a display panel 100 and a flexible film 200.

The display panel 100 is a panel for displaying an image. For example, the display panel 100 may be an electroluminescence display panel, a liquid crystal display panel, a plasma display panel, electrophoretic display panel or the like.

The display panel 100 may include a flexible substrate 110 and back plates 115 and 116.

The back plates 115 and 116 may include a first back plate 115, disposed under the flexible substrate 110, corresponds to a portion of the display area A/A and the non-display area N/A of the flexible substrate 110 and a second back plate 116 disposed corresponding to a portion of the non-display area N/A of the flexible substrate 110 and disposed under the first back plate 115 when bent. However, the present disclosure is not limited thereto.

The flexible substrate 110 is a flexible substrate supported by the back plates 115 and 116 and is a substrate for supporting the elements of the display panel 100. The flexible substrate 110 may be made of a material having flexibility, and may be made of a plastic material such as polyimide (PI) or the like.

Referring to FIGS. 1 and 2, the flexible substrate 110 may include a display area A/A and a non-display area N/A.

The display area A/A is an area where a plurality of pixels are arranged to display an image. The display area A/A of the flexible substrate 110 can be supported by the first back plate 115 to maintain a planar state. A display unit for displaying an image and a circuit unit for driving the display unit may be formed in the display area A/A. For example, when the flexible display device 1000 is an electroluminescence display device, the display unit may include an electroluminescence device. That is, the display unit may include an anode, a light emitting layer on the anode, and a cathode on the light emitting layer. The light emitting layer may be made of, for example, a hole-transporting layer, a hole-injecting layer, an electroluminescence layer, an electron-injecting layer, and an electron-transporting layer. However, when the flexible display device 1000 is a liquid crystal display device, the display unit may include a liquid crystal layer. Hereinafter, it is assumed that the exemplary flexible display device 1000 is an electroluminescence display device for convenience of explanation. However, the present disclosure is not limited thereto. The circuit unit may include various elements such as a thin film transistor, a capacitor, and a wire for driving the electroluminescence element. For example, the circuit unit may include various elements such as a driving thin film transistor, a switching thin film transistor, a storage capacitor, a gate line, and a data line. However, the present disclosure is not limited thereto.

The non-display area N/A is an area where an image is not displayed, and is an area where various lines, circuits, and the like for driving the display unit arranged in the display area A/A are disposed. In addition, a flexible film 200 in which driver ICs for driving various driving circuits and gate line or data line are arranged may be disposed in the non-display area N/A. The flexible display device 1000 according to an aspect of the present disclosure has a chip on film (COF) structure, but the present disclosure is not limited thereto. The gate driver IC may be formed in a gate in panel technique.

The non-display area N/A may be defined as an area extended from the display area A/A, as shown in FIG. 1. However, the present disclosure is not limited thereto, and the non-display area N/A may be defined to include an area surrounding the display area A/A. In addition, the non-display area N/A may be defined as an area extended from a plurality of sides of the display area A/A.

Referring to FIGS. 1 and 2, a signal line area SLA, a bending area BA, and a panel pad area PPA are disposed in a non-display area N/A. On the other hand, the average width (for example, in the horizontal direction) of the display area A/A may be wider than the average width (for example, in the horizontal direction) of the non-display area N/A. More specifically, the non-display area N/A may be reduced in width away from the display area A/A and widened in the panel pad area PPA.

The signal line area SLA is an area where a plurality of signal lines SL in which a plurality of extended data lines of the display area A/A is arranged. The signal line area SLA is supported by the first back plate 115 so that the planar state can be easily maintained. The signal line area SLA may be formed in the non-display area N/A or may include lines for transmitting signals from a driving circuit, a gate driving unit, e.g., gate-in-panel (GIP), a data driving unit, e.g., a data driver IC, and the like capable of being disposed in the flexible film 200 to the data lines and/or the gate lines arranged in the display area A/A. In the present aspect, a plurality of signal lines SL are connected to a plurality of data lines. However, the plurality of signal lines SL are not limited to these, and may be a gate line, a high potential voltage line, and a low potential voltage line, or may be electrically and/or physically connected to various lines.

The plurality of signal lines SL may be formed of a conductive material and may be formed of a conductive material having excellent ductility to minimize the occurrence of cracks when the flexible substrate 110 is bent. For example, the signal line SL may be formed of one of various conductive materials used in manufacturing the electroluminescence element of the display area A/A and the gate electrode, the source electrode, and the drain electrode of the thin film transistor, and it can be composed of single layer or multiple layers. For example, the signal line SL may be formed of one of molybdenum (Mo), chrome (Cr), titanium (Ti), nickel (Ni), neodymium (Ne), copper (Cu), silver (Ag), magnesium (Mg), and the like.

The plurality of signal lines SL arranged in the panel pad area PPA are not arranged in parallel with each other. This is because each of the plurality of panel pads PP disposed in the panel pad area PPA is arranged to have a different pitch, and each of the plurality of panel pads PP is arranged to be inclined at different angles. A more detailed description will be made with reference to the following drawings.

The bending area BA is an area in which the signal line area SLA is extended and is a bendable area on the final product, as shown in FIG. 2. Since the signal line SL disposed in the signal line area SLA is extended and arranged in the bending area BA and the bending area BA is the area bending in the final product, the pattern of the signal line SL may be a pattern having a specific shape for minimizing the stress concentrated on the signal line SL and the occurrence of cracks. For example, the signal line SL disposed in the bending area BA may include at least one of diamond, rhombus, zigzag, and round shapes for minimizing the crack. However, the present disclosure is not limited thereto. In the aspect of the present disclosure, the flexible substrate 110 may include the bending area BA. However, the flexible substrate 110 may not include the bending area BA. In this case, the portion regarded as the bending area BA in this aspect may be the signal line area SLA.

The panel pad area PPA is an area where a plurality of panel pads PP1, PP2, and PP3 to be bonded to the flexible film 200 are disposed. Each of the plurality of panel pads PP1, PP2, and PP3 is connected to the signal line SL disposed in the signal line area SLA.

The panel pad area PPA is supported by the second back plate 116. Accordingly, even if the flexible film 200 is disposed on the upper portion of the second back plate 116, the substantially flat shape of the panel pad area PPA can be easily maintained. Referring to FIG. 2, the panel pad area PPA of the flexible substrate 110 is bonded to a plurality of film pads FP1, FP2, and FP3 disposed on the flexible film 200, thus, is electrically connected to the flexible film 200. Accordingly, the display panel 100 can receive signals output from the flexible film 200 through the plurality of panel pads PP1, PP2, and PP3. The flexible film 200 may be bonded to a printed circuit board to receive a signal from the printed circuit board. For example, a display panel may be bonded to one side of the flexible film, and a printed circuit board may be bonded to the other side of the flexible film. The display panel 100 can transmit a signal output from the display panel 100 to the flexible film 200 through a plurality of panel pads PP1, PP2, and PP3.

The non-display area N/A of the flexible substrate 110 according to the present disclosure may be provided with a coating layer 119 for suppressing penetration of moisture and cracks in line. The coating layer 119 is made of an insulating material, for example, an organic material. Specifically, the coating layer 119 relieves stress caused by bending in the bending area BA to suppress cracking. However, the present disclosure is not limited thereto.

The flexible film 200 electrically connects the display panel 100 and a printed circuit board that outputs driving signals of the display panel 100. Accordingly, the flexible film 200 can transmit a signal output from the printed circuit board to the display panel 100 and/or the printed circuit board.

The flexible film 200 may be made of a material having flexibility, for example, a plastic material such as polyimide (PI) or the like. On the other hand, the flexible film 200 according to an aspect of the present disclosure may include a chip-on film (Chip), in which a driver IC for generating and outputting a driving signal for a pixel disposed on the display panel 100, disposed on a flexible base layer 210.

The flexible film 200 includes a base layer 210, a first conductive layer 220, a plurality of film pads FP1, FP2, and FP3, and a second conductive layer 230. Referring to FIG. 2, the flexible film 200 is described such that the first conductive layer 220 and the second conductive layer 230 are included in the flexible film 200, that is, the flexible film 200 having two conductive layers has been described as an example. However, the present disclosure is not limited thereto.

The base layer 210 is a layer for supporting the flexible film 200. The base layer 210 may be made of an insulating material, and may be made of an insulating material having flexibility. The base layer 210 may be made of the same material as that of the flexible substrate 110 or may be made of another material.

The first conductive layer 220 is disposed on the bottom surface of the base layer 210 and may be formed of a metal material having excellent conductivity. The first conductive layer 220 may be patterned to form a plurality of film pads FP1, FP2, and FP3. Accordingly, the first conductive layer 220 and the plurality of film pads FP1, FP2, and FP3 are electrically connected.

The plurality of film pads FP1, FP2, and FP3 are electrically connected to the plurality of panel pads PP1, PP2, and PP3 disposed on the flexible substrate 110, thereby transmitting a control signal transmitted from the printed circuit board to the display panel 100. The plurality of film pads FP1, FP2, and FP3 may be made of a metal material having the same conductivity as the first conductive layer 220 and may have a pattern corresponding to the plurality of panel pads PP1, PP2, and PP3.

The upper surfaces of the film pads FP1, FP2, and FP3, which is the adhering surfaces in contact with the flexible substrate 110, can be widened by the thickness T2 of the plurality of film pads FP1, FP2, and FP3. More specifically, if the thickness T2 of the plurality of film pads FP1, FP2, and FP3 is minimized, a plurality of film pads FP1, FP2, and FP3, which are adhered to the plurality of panel pads PP1, PP2, and PP3 can be widened. At this time, the thickness T2 of the plurality of film pads FP1, FP2, and FP3 may be thinner than the thickness T1 of the plurality of panel pads PP1, PP2, and PP3. Accordingly, the plurality of film pads FP1, FP2, and FP3 of the flexible film 200 according to an exemplary aspect of the present disclosure may be disposed on the base layer 210 to have a minimum thickness. However, the present disclosure is not limited thereto.

When the thickness T2 of the plurality of film pads FP1, FP2, and FP3 of the flexible film 200 is minimized, the upper surfaces of the plurality of film pads FP1, FP2, and FP3 are widened. Accordingly, the adhering area of the flexible substrate 110 to the plurality of panel pads PP1, PP2, and PP3 is widened and misalignment between the flexible substrate 110 and the flexible film 200 can be minimized.

Various aspects of the shape of the plurality of film pads FP1, FP2, and FP3 will be described in detail with reference to FIGS. 3A to 3C.

The second conductive layer 230 is disposed on the upper surface of the base layer 210. The second conductive layer 230 may be formed of a metal material having excellent conductivity.

Although not shown, the flexible film 200 may further include a first protective layer for protecting the first conductive layer 220 and a second protective layer for protecting the second conductive layer 230. The first protective layer and the second protective layer may be formed of an insulating material such as a solder resist.

An adhesive layer 300 is disposed between the flexible substrate 110 and the flexible film 200. The adhesive layer 300 includes conductive particles for electrically connecting the panel pad area PPA of the flexible substrate 110 and the film pad area FPA of the flexible film 200. The adhesive layer 300 may be, for example, an anisotropic conductive film (ACF) or a conductive paste. More specifically, in the flexible substrate 110 and the flexible film 200, heat and pressure are applied to the panel pad area PPA of the flexible substrate 110 by a bonding machine. Accordingly, the plurality of panel pads PP1, PP2, and PP3 of the panel pad area PPA of the flexible substrate 110 and the plurality of film pads FP1, FP2, and FP3 of the film pad area FPA of the flexible film 200 are electrically connected, respectively. Due to temperature change by heat and pressure treatment, each of a plurality of panel pads arranged in the panel pad area PPA of the flexible substrate 110 and each of a plurality of film pads in the film pad area FPA of the flexible film 200 can be expanded. However, when the flexible substrate 110 and the flexible film 200 are made of different materials, or because the expanding ratio at the same temperature condition is different depending on the treatment or process conditions during the thermo-compression bonding process, misalignment may occur between the panel pads PP1, PP2 and PP3 and the plurality of film pads FP1, FP2, and FP3 arranged on the flexible film 200. Accordingly, a reordering process for minimizing misalignment between the plurality of panel pads PP1, PP2, PP3 of the flexible substrate 110 and the plurality of film pads FP1, FP2, FP3 of the flexible film 200 is needed.

Accordingly, in an aspect of the present disclosure, a plurality of panel pads PP1, PP2, and PP3 disposed on the flexible substrate 110 and a plurality of film pads FP1, FP2, and FP3 disposed on the flexible film 200 are arranged to have a pattern corresponding to each other so as to minimize misalignment capable of y-axis correction even if the expansion ratio varies due to various bonding process conditions.

In an aspect of the present disclosure, a plurality of panel pads PP1, PP2, and PP3 disposed on the flexible substrate 110 and a plurality of film pads FP1, FP2, and FP3 disposed on the flexible film 200 are disposed to have different pitches without disposing them in a form of a plurality of blocks. Thus, it is possible to provide the flexible display device 1000 of high resolution while minimizing the increase of the bezel area by disposing it to have more pad rows than in the prior art.

In other words, a block-form is easier to design a plurality of blocks having different slopes in specific sections. However, misalignment may occur between the blocks because of the abrupt slope change between the blocks. On the contrary, if the slopes of the respective pads are designed differently from each other, the degree of difficulty of design increases. However, in such a case, there is substantially no sudden change in tilt between blocks, so that the above-described block-to-block misalignment problem may not occur.

In addition, the thickness of the plurality of film pads FP1, FP2, and FP3 disposed on the flexible film 200 according to an aspect of the present disclosure is minimized and is adhered to the plurality of panel pads PP1, PP2, and PP3. Accordingly, it is possible to minimize the misalignment between the flexible substrate 110 and the flexible film 200 by increasing the adhesion surface of the plurality of film pads FP1, FP2, and FP3.

Shapes of a plurality of panel pads PP1, PP2, and PP3 arranged on the flexible substrate 110 and a plurality of film pads FP1, FP2, and FP3 arranged on the flexible film 200 according to an aspect of the present disclosure will be described in more detail.

Figure 3A:
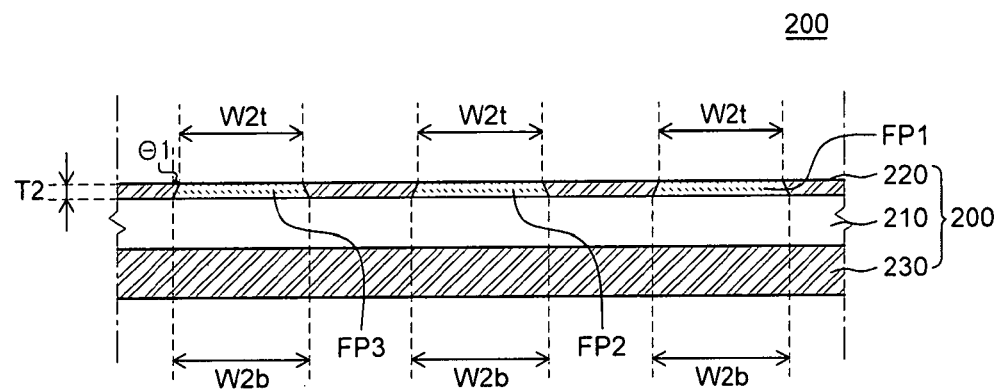
FIGS. 3A to 3C are cross-sectional views illustrating various aspects of the shape of a pad disposed on a flexible film according to an aspect of the present disclosure.
Figure 3B:
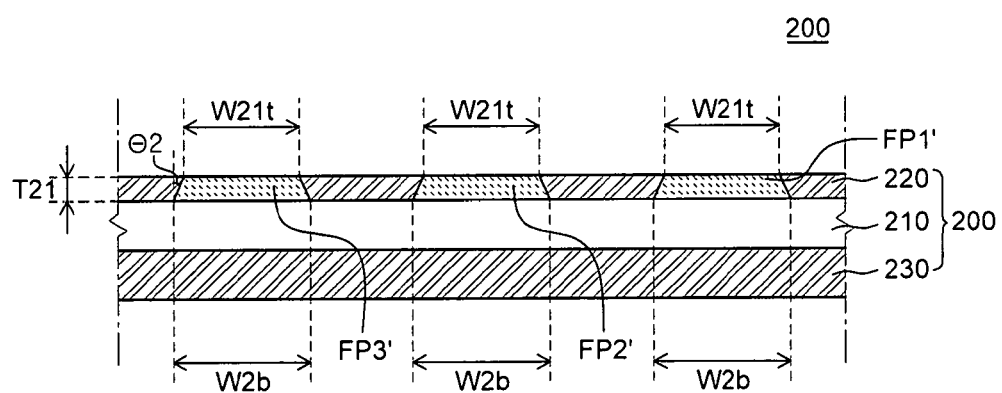
Figure 3C:
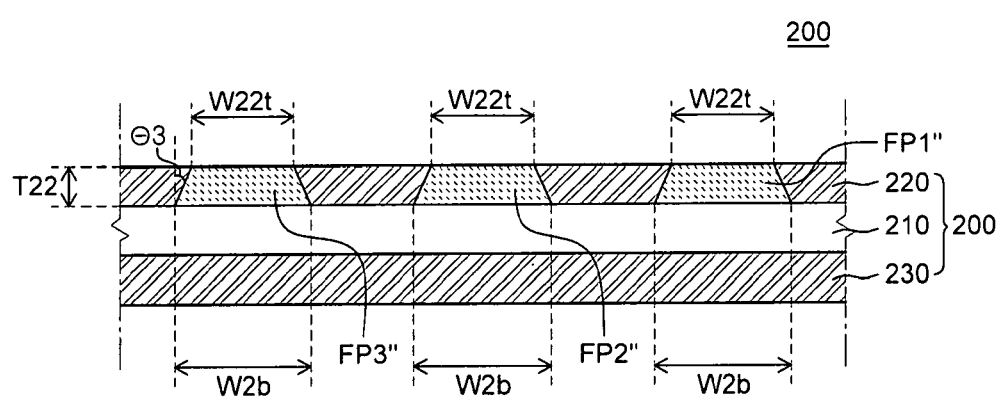

FIGS. 3A to 3C are cross-sectional views illustrating various aspects of the shape of a pad disposed on a flexible film according to an aspect of the present disclosure.

FIGS. 3A and 3B show a flexible film 200 of FIG. 2. Referring to FIGS. 3A and 3B, a plurality of film pads FP1, FP2, and FP3 are disposed on a base layer 210 of a flexible film 200.

Referring to FIG. 3A, all of the film pads FP1, FP2, and FP3 have the same first thickness T2. The bottom surface of the film pads FP1, FP2, FP3 of the first thickness, which contacts the base layer 210, has a first lower width W2$b$. The upper surfaces of the film pads FP1, FP2, and FP3 of the first thickness, which contact the panel pads PP1, PP2, and PP3 of the flexible substrate 110, have a first upper surface width W2$t$.

Referring to FIG. 3B, the film pads FP1', FP2', and FP3' have the same second thickness T21. The bottom surface of the film pads FP1', FP2' and FP3' of the second thickness, which contacts the base layer 210, has a first lower width W2$b$. The upper surfaces of the film pads FP1', FP2', and FP3' of the second thickness, which contact the panel pads PP1, PP2 and PP3 of the flexible substrate 110, have the second upper surface width W21$t$. At this time, the bottom surface widths of the film pads FP1, FP2, and FP3 of the first thickness and the film pads FP1', FP2', and FP3' of the second thickness have the same width. On the other hand, the second thickness T21 of the film pads FP1', FP2', and FP3' of the second thickness is thicker than the first thickness T1 of the film pads FP1, FP2, and FP3 of the first thickness. The second upper surface width W21$t$ of the film pads FP1', FP2' and FP3' of the second thickness is smaller than the first upper surface width W2$t$ of the film pads FP1, FP2, and FP3 of the first thickness.

Referring to FIG. 3C, the film pads FP1", FP2", and FP3" have the same third thickness T22. The bottom surface of the film pads FP1", FP2" and FP3" of the third thickness, which contacts the base layer 210, has a first lower width W2$b$. The upper surfaces of the film pads FP1", FP2", and FP3" of the third thickness, which contact the panel pads PP1, PP2 and PP3 of the flexible substrate 110, have the third upper surface width W22$t$. At this time, the bottom surface widths of the film pads FP1", FP2", and FP3" of the third thickness, the bottom surface widths of the film pads FP1, FP2, and FP3 of the first thickness, and the bottom surface widths of the film pads FP1', FP2', and FP3' of the second thickness have the same width to the first lower width W2$b$. However, the third thickness T22 of the third film pads FP1", FP2", and FP3" is greater than the second thickness T21 of the second film pads FP1', FP2', and FP3'. The third upper surface width W22$t$ of the film pads FP1", FP2", and FP3" of the third thickness is less than the second upper surface width W21$t$ of the film pads FP1', FP2', and FP3' of the second thickness.

Referring to FIGS. 3A to 3C, it is noted that as the thickness of the film pads FP1, FP2, and FP3 becomes thinner, the width of the upper surface of the film pads FP1, FP2, and FP3, which are the adhesion surfaces to the panel pads PP1, PP2 and PP3, becomes wider. At this time, the thickness of the film pads FP1, FP2, FP3 may have a thickness of 1000 Å or more and 8 μm or less. However, the present disclosure is not limited thereto.

The widths of the upper surfaces of the film pads FP1, FP2, and FP3 that are the adhesion surfaces of the panel pads PP1, PP2, and PP3 can be varied depending on the inclination of the side surfaces of the film pads FP1, FP2, and FP3. That is, regarding the inclination θ of the side surface of the film pad, the inclination θ1 of the film pads FP1, FP2, FP3 of the first thickness as shown in FIG. 3A may be smaller than the inclination θ3 of the film pads FP1", FP2", and FP3" of the third thickness as shown in FIG. 3C. That is, referring to FIGS. 3A to 3C, it can be seen that as the slope of the film pads FP1, FP2, FP3 decreases, the width of the upper surface increases. At this time, the slope of the film pads FP1, FP2, and FP3 may have a slope of 5° or more and 25° or less. The above-mentioned slope is a taper of the pad, and the taper angle is an angle generated by a deposition or etching process condition for patterning the pad. Particularly, in such a taper, the thickness of the pad becomes thicker, and then the difference between the upper surface width and the bottom surface width of the pad is increased. Therefore, a thick pad may cause difficulty in reducing the pitch by the taper.

Accordingly, the film pads FP1, FP2, and FP3 according to the aspect of the present disclosure can be disposed to have a minimum cross-sectional thickness. Accordingly, the upper surfaces of the film pads FP1, FP2, and FP3, which are the contact surfaces of the film pads FP1, FP2, and FP3 and the panel pads PP1, PP2, and PP3 are widened. Therefore, even if the expansion ratio between the flexible substrate 110 and the flexible film 200 changes due to the difference in material or process conditions, the overlapping area of the flexible substrate 110 and the flexible film 200 can be increased.

The number of the film pads FP1, FP2, and FP3 disposed on the flexible film 200 can be determined according to the thickness of the film pads FP1, FP2, and FP3 according to one aspect of the present disclosure. That is, by arranging the film pads FP1, FP2, and FP3 to be thin in thickness, more film pads FP1, FP2, and FP3 are formed on the film pad area FPA of the flexible film 200, Further, according to an aspect of the present disclosure, the number of the film pads FP1, FP2, and FP3 disposed on the flexible film 200 can be determined according to the thickness of the film pads FP1, FP2, and FP3. That is, more film pads FP1, FP2, and FP3 can be disposed on the film pad area FPA of the flexible film 200 by decreasing thickness of the film pads FP1, FP2 and FP3. Accordingly, the flexible display device 1000 according to an aspect of the present disclosure can provide a flexible display device with high integration or dense interval.

Figure 4:
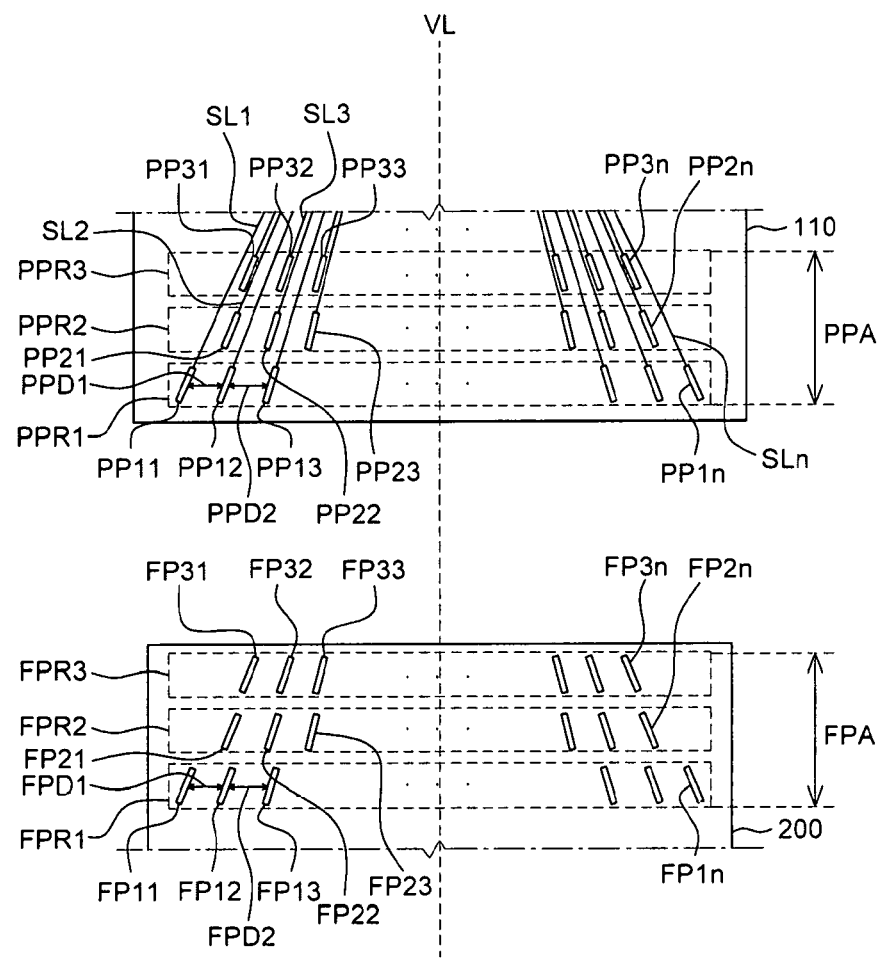
FIG. 4 is a plan view showing a panel pad area of the display panel in area A of FIG. 1 and a film pad area of the flexible film.

FIG. 4 is a plan view showing a panel pad area of the display panel in the area A of FIG. 1 and a film pad area of the flexible film.

Referring to FIG. 4, a plurality of panel pads PP11, PP12, PP13 . . . PP1n, PP21, PP22, PP23 . . . PP2n, PP31, PP32, PP33 . . . PP3n are provided in the panel pad area PPA on the flexible substrate 110.

The plurality of panel pads PP11, PP12, PP13 . . . PP1n, PP21, PP22, PP23 . . . PP2n, PP31, PP32, PP33 . . . PP3n may include a first panel pad row PPR1, a second panel pad row PPR2, and a third panel pad row PPR3, which are extended in the row direction. In an aspect of the present disclosure, a plurality of pads PP11, PP12, PP13 . . . PP1n, PP21, PP22, PP23 . . . PP2n, PP31, PP32, PP33 . . . PP3n disposed in the panel pad area PPA are disposed in three rows as an example, however, the present disclosure is not limited thereto.

The bottom surface widths of the plurality of panel pads PP11, PP12, PP13 . . . PP1n, PP21, PP22, PP23 . . . PP2n, PP31, PP32, PP33 . . . PP3n in contact with the flexible substrate 110 can be all set to be the same.

The number of pad rows disposed on the panel pad area PPA can be determined according to the bottom surface width W1 of such plurality of panel pads PP11, PP12, PP13 . . . PP1n, PP21, PP22, PP23 . . . PP2n, PP31, PP32, PP33 . . . PP3n. For example, as the plurality of pads PP11, PP12, PP13 . . . PP1n, PP21, PP22, PP23 . . . PP2n, PP31, PP32, PP33 . . . PP3n have a narrower width, more rows of a plurality of panel pads PP11, PP12, PP13 . . . PP1n, PP21, PP22, PP23 . . . PP2n, PP31, PP32, PP33 . . . PP3n may be arranged. Accordingly, in an aspect of the present disclosure, the panel pad area PPA is described as three rows of panel pads, but with the narrower the width of the panel pad, the more the rows can be arranged in a plurality of n rows.

The plurality of panel pads PP11, PP12, PP13 . . . PP1n, PP21, PP22, PP23 . . . PP2n, PP31, PP32, PP33 . . . PP3n may be disposed to have different slopes. The plurality of panel pads PP11, PP12, PP13 . . . PP1n, PP21, PP22, PP23 . . . PP2n, PP31, PP32, PP33 . . . PP3n are connected in reference to an imaginary central vertical line VL of the flexible substrate 110 such that the inclination of the panel pad may be increased toward the periphery of the substrate. Accordingly, the panel pad area PPA of the flexible substrate 110 can be disposed to have a fan shape. The fan shaped pads may have a radial slope. At this time, the fan-shaped pattern may be formed according to the size of the driver IC and the size of the panel pad area PPA. More specifically, a plurality of panel pads may be disposed in a fan shape pattern when the size of the driver IC is 20% or less of the panel pad area PPA. Accordingly, it is possible to easily correct even if misalignment occurs when the plurality of panel pads PP11, PP12, PP13 . . . PP1n, PP21, PP22, PP23 . . . PP2n, PP31, PP32, PP33 . . . PP3n disposed in the panel pad area PPA of the flexible substrate 110 and the plurality of film pads FP11, FP12, FP13 . . . FP1n, FP21, FP22, FP23 . . . FP2n, FP31, FP32, FP33 . . . FP3n disposed in the film pad area WA of the flexible film 200 are adhered by the adhesive layer 300. This is because the plurality of panel pads PP11, PP12, PP13 . . . PP1n, PP21, PP22, PP23 . . . PP2n, PP31, PP32, PP33 . . . PP3n according to an aspect of the present disclosure are arranged in a fan shape in reference to the reference point P.

Accordingly, the plurality of panel pads PP11, PP12, PP13 . . . PP1n, PP21, PP22, PP23 . . . PP2n, PP31, PP32, PP33 . . . PP3n disposed on the flexible substrate 110 according to an aspect of the present disclosure, each of the pads is arranged to be inclined at a specific angle, and since the pad widths of the respective panel pads PP are the same, they can be arranged in more pad rows than a conventional arrangement.

In other words, conventionally, a plurality of panel pads is arranged in a plurality of blocks form. Further, each pad is arranged to have different pad widths and different pitches for different blocks. However, in the same block, each pad is arranged to have the same pad width and the same pitch. Also the plurality of panel pads PP11, PP12, PP13 . . . PP1n, PP21, PP22, PP23 . . . PP2n, PP31, PP32, PP33 . . . PP3n are not tilted in such way. Therefore, the number of possible arrangement of the pads is limited. In an aspect of the present disclosure, all of the pads having the same pad width and the inclined shape are disposed at different pitches from each other, so that it is possible to have a larger number of pad rows than the conventional method.

For example, conventionally, a maximum of two rows are possible. However, in an aspect of the present disclosure, a plurality of panel pads PP11, PP12, PP13 . . . PP1n, PP21, PP22, PP23 . . . PP23, PP2n, PP31, PP32 . . . PP3n may be arranged in three or more rows. Accordingly, the flexible display device according to an aspect of the present disclosure can arrange a large number of panel pads without increasing the non-display area, that is, the bezel area, thereby providing a high-resolution flexible display device. The arrangement and shape of the plurality of panel pads PP11, PP12, PP13 . . . PP1n, PP21, PP22, PP23 . . . PP2n, PP31, PP32, PP33 . . . PP3n disposed in the panel pad area PPA of the flexible substrate 110 will be described in more detail with reference to FIG. 5.

The first panel pad row PPR1 is a row disposed in the outermost the panel pad area PPA, that is, a plurality of pads PP11, PP12, PP13 . . . PP1n are arranged in an area adjacent to the printed circuit board. Each of the plurality of pads PP11, PP12, PP13 . . . PP1n disposed in the first panel pad row PPR1 may be disposed at different pitches from the adjacent pads. For example, the first panel pad PP11 of the first panel pad row PPR1 and the second panel pad PP12 of the first panel pad row PPR1 adjacent thereto are arranged in the first panel interval PPD1. The second panel pad PP12 of the first panel pad row PPR1 and the third panel pad PP13 of the second panel pad row PPR1 adjacent thereto may be disposed in the second panel interval PPD2. The first panel interval PPD1 may have a narrower space than the second panel interval PPD2. In addition, each of the plurality of pads PP11, PP12, PP13 . . . PP1n disposed in the first panel pad row PPR1 may be disposed to have different slopes. The first panel pad row PPR1 may be a reference row in the panel pad area PPA. That is, the second panel pad row PPR2 and the third panel pad row PPR3 may be disposed in reference to the first panel pad row PPR1.

The second panel pad row PPR2 may be in the middle area of the panel pad area PPA. That is, a row disposed between the first panel pad row PPR1 and the third panel pad row PPR3. The plurality of panel pads PP21, PP22, PP23 . . . PP2n disposed in the second panel pad row PPR2 may be disposed at different pitches from the adjacent pads. The plurality of panel pads PP21, PP22, PP23 . . . PP2n disposed in the second panel pad row PPR2 may be disposed to have different slopes. The plurality of panel pads PP21, PP22, PP23 . . . PP2n disposed in the second panel pad row PPR2 may be disposed in reference to the first panel pad row PPR1. More specifically, the first panel pad PP21 of the second panel pad row PPR2 is located at an intermediate point between the first panel pad PP11 and the second panel pad PP12 of the first panel pad row PPR1, That is, ½ point. The plurality of panel pads PP21, PP22, PP23 . . . PP2n of the second panel pad row PPR2 may be disposed in a fan shape in reference to the reference point.

The third panel pad row PPR3 is a row disposed in the panel pad area PPA adjacent to the display area A/A. The plurality of pads PP31, PP32, PP33 . . . PP3n disposed in the third panel pad row PPR3 may be disposed at different pitches from the adjacent pads. The plurality of panel pads PP31, PP32, PP33 . . . PP3n disposed in the third panel pad row PPR3 may be disposed to have different slopes. The plurality of panel pads PP31, PP32, PP33 . . . PP3n disposed in the third panel pad row PPR3 may be disposed in reference to the first panel pad row PPR1. More specifically, the first panel pad PP31 of the third panel pad row PPR3 is disposed to correspond to the ⅓ point between the first panel pad PP11 of the first panel pad row PPR1 and the second panel pad PP12. The plurality of panel pads PP31, PP32, PP33 . . . PP3n of the third panel pad row PPR3 may be disposed in a fan shape in reference to the reference point.

In conclusion, when the panel pad rows of the flexible substrate 110 according to an aspect of the present disclosure are disposed in a total of n rows, the pads of the rows farthest from the reference row in reference to the reference row are arranged at 1/n point. The pads of the row closest to the reference row and the row closest to the reference row are arranged at 1/n−1 points.

The plurality of panel pads PP11, PP12, PP13 . . . PP1n, PP21, PP22, PP23 . . . PP2n, PP31, PP32, PP33 . . . PP3n disposed in the panel pad area PPA of the flexible substrate 110 are connected to a plurality of signal lines SL2, SL3 . . . SLn, respectively. The first signal line SL1 may be connected to the first panel pad PP11 of the first panel pad row PPR1, the second signal line SL2 may be connected to the first panel pad PP11 of the third panel pad row PPR3, and the third signal line SL3 may be connected to the first panel pad PP21 of the second panel pad row PPR2. As described above, since the panel pads PP11, PP12, PP13 . . . PP13n, PP21, PP22, PP23 . . . PP2n, PP31, PP32, PP33 . . . PP3n are arranged to be inclined at different slopes, the signal lines SL1, SL2, SL3 . . . SLn may also be arranged so as not to be parallel to each other. Further, the intervals of the plurality of signal lines SL1, SL2, SL3 . . . SLn may also be disposed differently. That is, the interval between the first signal line SL1 and the second signal line SL2 and the interval between the second signal line SL2 and the third signal line SL3 may be different from each other.

The plurality of film pads FP11, FP12, FP13 . . . FP1n, FP21, FP22, FP23 . . . FP2n, FP31, FP32, FP33 . . . FP3n disposed on the film pad area FPA on the flexible film 200 may be connected to the plurality of panel pads PP11, PP12, PP13 . . . PP1n, PP21, PP22, PP23 . . . PP2n, PP31, PP32, PP33 . . . PP3n disposed in the panel pad area PPA of the flexible substrate 110. More specifically, a plurality of film pads FP11, FP12, FP13 . . . FP1n, FP21, FP22, FP23 . . . FP2n, FP31, FP32, FP33 . . . FP3n arranged in the film pad area FPA on the flexible film 2000 includes a first film pad row FPR1, a second film pad row FPR2, and a third film pad row FPR3 extending in the row direction. In an aspect of the present disclosure, a plurality of film pads FP11, FP12, FP13 . . . FP1n, FP21, FP22, FP23 . . . FP2n, FP31, FP32, FP33 . . . FP3n are described as three pad rows. However, the present disclosure is not limited thereto.

The plurality of film pads FP11, FP12, FP13 . . . FP1n, FP21, FP22, FP23 . . . FP2n, FP31, FP32, FP33 . . . FP3n may be disposed to have the same width, that is, the same bottom surface width. The width of the plurality of film pads FP11, FP12, FP13 . . . FP1n, FP21, FP22, FP23 . . . FP2n, FP31, FP32, FP33 . . . FP3n may have a different value from the width W1 of the flexible substrate 110. This is because the flexible substrate 110 and the flexible film 200 can be made of different materials and can have different thicknesses. Accordingly, thermal expansion ratio of the respective panel pads PP11, PP12, PP13 . . . PP1n, PP21, PP22, PP23 . . . PP2n, PP31, PP32, PP33 . . . PP3n and the film pads FP11, FP12, FP13 . . . FP1n, FP21, FP22, FP23 . . . FP2n, FP31, FP32, FP33 . . . FP3n may differ from each other.

The number of pad rows arranged on the film pad area FPA can be determined by the width of the plurality of film pads FP11, FP12, FP13 . . . FP1n, FP21, FP22, FP23 . . . FP2n, FP31, FP32, FP33 . . . FP3n. For example, as the plurality of film pads FP11, FP12, FP13 . . . FP1n, FP21, FP22, FP23 . . . FP2n, FP31, FP32, FP33 . . . FP3n have a narrow width, the plurality of film pads FP11, FP12, FP13 . . . FP1n, FP21, FP22, FP23 . . . FP2n, FP31, FP32, FP33 . . . FP3n may have more pad rows that can be arranged. Accordingly, in an aspect of the present disclosure, the number of film pad rows is three in the film pad area FPA. However, as the width of the film pad is narrower, it may be disposed in three or more rows. However, as the width of the film pad is wider, it may be disposed in three or less rows.

As described above, when the first width W1 of the plurality of panel pads PP11, PP12, PP13 . . . PP13n, PP21, PP22, PP23 . . . PP2n, PP31, PP32 . . . PP3n is narrower than the second width W2 of the plurality of film pads FP1, FP12, FP13 . . . FP1n, FP21, FP22, FP23 . . . FP2n, FP31, FP32, FP33 . . . FP3n, the number of panel pad rows arranged in the panel pad area PPA of the flexible substrate 110 may be larger than the number of film pad rows arranged in the film pad area FPA of the flexible film 200.

The plurality of film pads FP11, FP12, FP13 . . . FP1n, FP21, FP22, FP23 . . . FP2n, FP31, FP32, FP33 . . . FP3n may be arranged to have different slopes. More specifically, the plurality of film pads FP11, FP12, FP13, FP1n, FP21, FP22, FP23 . . . FP2n, FP31, FP32, FP33 . . . FP3n are connected in reference to an imaginary central vertical line VL of the flexible film 200 such that the inclination of the panel pad may be increased toward the periphery of the film. Accordingly, the film pad area FPA of the flexible film 200 can be disposed to have a fan shape.

The first film pad row FPR1 is a row disposed in the outermost the film pad area FPA, that is, a plurality of pads FP11, FP12, FP13 . . . FP1n are disposed in an area adjacent to the printed circuit board. The plurality of film pads FP11, FP12, FP13 . . . FP1n disposed in the first film pad row FPR1 may be disposed at different pitches from the adjacent pads. For example, the first film pad FP11 of the first film pad row FPR1 and the second film pad FP12 of the first film pad row PPR1 adjacent thereto are arranged in the first film pad interval FPD1. The second film pad FP12 of the first film pad row FPR1 and the third film pad FP13 of the second film pad row FPR1 adjacent thereto may be disposed in the second film pad interval FPD2. The first film pad interval FPD1 and the second film pad interval FPD2 have different pitches. Further, each of the plurality of film pads FP11, FP12, FP13 . . . FP1n disposed in the first film pad row FPR1 may be disposed to have different slopes. Such a first film pad row FPR1 may be a reference row in the film pad area FPA. That is, the second film pad row FPR2 and the third film pad row FPR3 may be disposed in reference to the first film pad row FPR1.

The second film pad row FPR2 is a middle row of the film pad area FPA, i.e., a row disposed between the first film pad row FPR1 and the third film pad row FPR3. Each of the plurality of film pads FP21, FP22, FP23 . . . FP2n disposed in the second film pad row FPR2 may be disposed at different pitches from the adjacent pads. The plurality of film pads FP21, FP22, FP23 . . . FP2n disposed in the second film pad row FPR2 may be disposed to have different slopes. A plurality of film pads FP21, FP22, FP23 . . . FP2n disposed in the second film pad row FPR2 may be disposed in reference to the first film pad row FPR1. More specifically, the first film pad FP21 of the second film pad row FPR2 is positioned at an intermediate point between the first film pad FP11 and the second film pad FP12 of the first film pad row FPR1, That is, ½ point. The plurality of film pads FP21, FP22, FP23 . . . FP2n of the second film pad row FPR2 may be disposed in a fan shape in reference to the reference point.

The third film pad row FPR3 is a row disposed in the area of the film pad area FPA adjacent to the flexible substrate 110. Each of the plurality of film pads FP31, FP32, FP33 . . . FP3n disposed in the third film pad row FPR3 may be disposed at different pitches from the adjacent pads. The plurality of film pads FP31, FP32, FP33 . . . FP3n disposed in the third film pad row FPR3 may be disposed to have different slopes. A plurality of film pads FP31, FP32, FP33 . . . FP3n disposed in the third film pad row FPR3 may be disposed in reference to the first film pad row FPR1. More specifically, the first film pad FP31 of the third film pad row FPR3 is disposed to correspond to the ⅓ point between the first film pad FP11 of the first film pad row FPR1 and the second film pad FP12. The plurality of film pads FP31, FP32, FP33 . . . FP3n of the third film pad row FPR3 may be disposed in a fan shape in reference to the reference point.

In conclusion, when the film pad rows of the flexible film 200 according to an aspect of the present disclosure are disposed in a total of n rows, the pads of the rows farthest from the reference row in reference to the reference row are disposed at 1/n point. The pads of the row closest to the reference row and the row closest to the reference row are arranged at 1/n−1 points.

Figure 5:
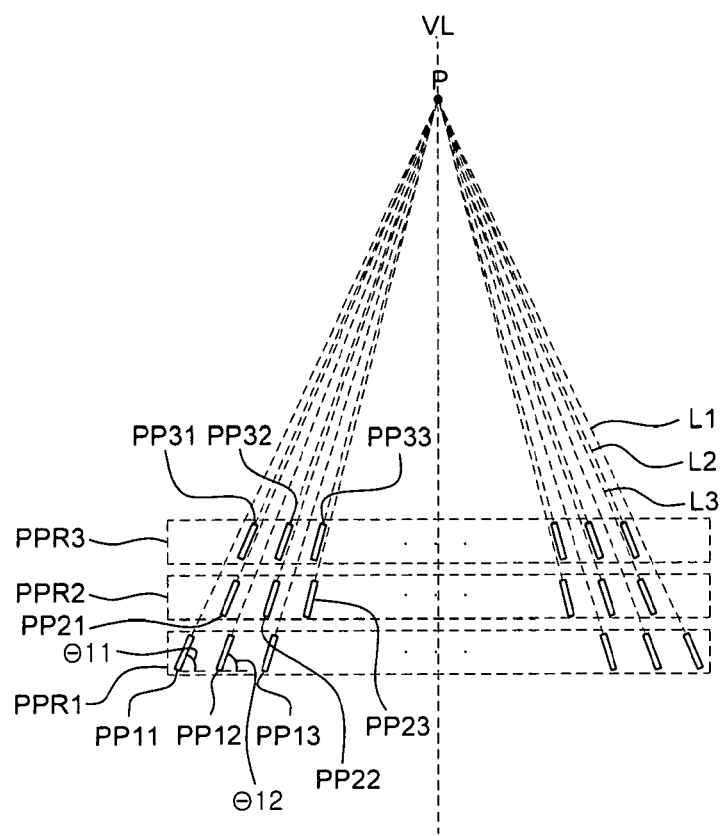
FIG. 5 is a plan view for explaining a form of a panel pad area according to an aspect of the present disclosure.

FIG. 5 is a plan view for explaining the shapes of a panel pad area and a film pad area according to an aspect of the present disclosure.

Before referring to FIG. 5, it should be noted that since the pads of the panel pad area PPA and the film pad area FPA are arranged in the same manner. Accordingly, the pads arranged in the panel pad area PPA will be mainly described with reference to FIG. 5.

Referring to FIG. 5, a plurality of panel pads PP11, PP12, PP13 . . . PP1n, PP21, PP22, PP23 . . . PP2n, PP31, PP32, PP33 . . . PP3n disposed in the panel pad area PPA of the flexible substrate 110 can be arranged in a fan shape based on the reference point P. At this time, the reference point P may be an arbitrary point arranged above the central area in the vertical direction of the panel pad area PPA. The plurality of panel pads PP11, PP12, PP13 . . . PP1n, PP21, PP22, PP23 . . . PP2n, PP31, PP32, PP33 . . . PP3n of the panel pad area PPA of the flexible substrate 110 can be tilted at different angles from each other. Further, the first panel pad PP11 of the first panel pad row PPR1 of the panel pad area PPA inclined at a first angle θ11 and the second panel pad PP11 of the first panel pad row PPR1 inclined at a second angle θ12 have mutually different angles. Further, the degree of the first angle θ11 may be smaller than the degree of the second angle θ12. That is, the first panel pad PP1 can be tilted closer to the horizontal direction than the second panel pad PP2.

The inclination of the first panel pad PP11 of the first panel pad row PPR1 and the first panel pad PP21 of the second panel pad row PPR2 may be different from each other. As a result, the plurality of panel pads PP11, PP12, PP13 . . . PP1n, PP21, PP22, PP23 . . . PP2n, PP31, PP32, PP33 . . . PP3n are gradually tilted from the central vertical area of the panel pad area PPA to the horizontal area toward the periphery. The inclination of the plurality of panel pads PP11, PP12, PP13 . . . PP1n, PP21, PP22, PP23 . . . PP2n, PP31, PP32, PP33 . . . PP3n may set the central line P corresponding to the size of the driver IC and the size of the panel pad area PPA and the slope may be changed according to the configuration of the central line P. As a result, the panel pads PP11, PP12, PP13 . . . PP1n, PP21, PP22, PP23 . . . PP2n, PP31, PP32, PP33 . . . PP3n may vary depending on the size of the panel pad area PPA and the size of the driver IC.

In addition, the plurality of panel pads PP11, PP12, PP13 . . . PP1n, PP21, PP22, PP23 . . . PP2n, PP31, PP32, PP33 . . . PP3n are arranged with reference to an arbitrary reference point P. Accordingly, based on an arbitrary reference point P, a plurality of panel pads PP11, PP12, PP13, PP21, PP22, PP23, PP31, PP32, and PP33 on the left side of the reference point P and a plurality of right side panel pads PP1n-2, PP1n-1, PPn, PP2n-2, PP2n-1, PP2n, PP3n-2n, PP3n-1, and PP3n may be symmetrical tilted with respect to each other.

Figure 6A:
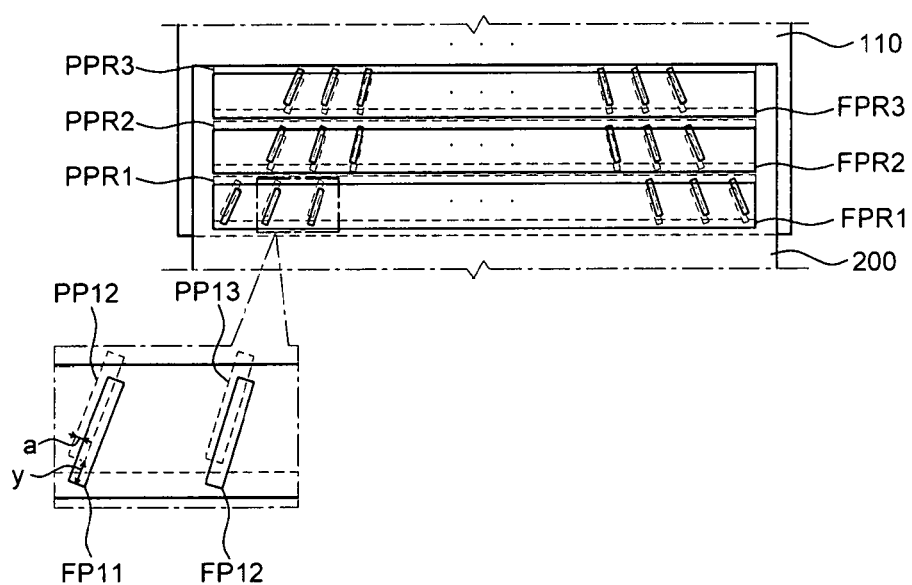
FIG. 6A is a plan view showing a state in which a display panel and a flexible film are aligned in a first order according to an aspect of the present disclosure.
Figure 6B:
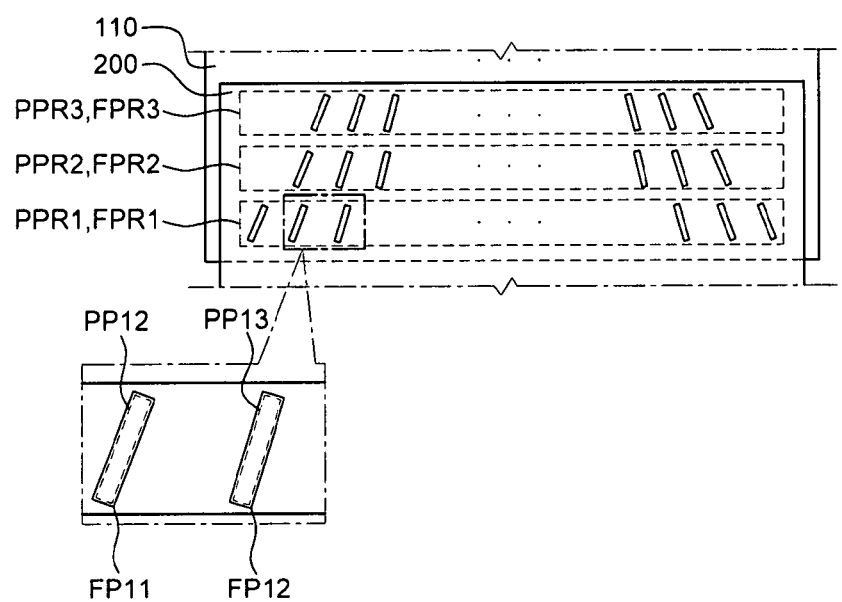
FIG. 6B is a plan view showing a state in which the display panel and the flexible film are finally aligned according to an aspect of the present disclosure.

FIG. 6A is a plan view showing a state in which a display panel and a flexible film are aligned in a first order according to an aspect of the present disclosure. FIG. 6B is a plan view showing a state where the display panel and the flexible film are finally aligned according to an aspect of the present disclosure.

Referring to FIG. 6A, the panel pad area PPA of the flexible substrate 110 of the display panel 100 and the film pad area FPA of the flexible film 200 are disposed to face each other so as to be aligned. Although not shown, an alignment mark may be provided on the flexible substrate 110 and the flexible film 200 so that the panel pads PP11, PP12, PP13 . . . PP1n, PP21, PP22, PP23 . . . PP2n, PP31, PP32, PP33 . . . PP3n of the flexible substrate 110 and the film pads FP11, FP12, FP13 . . . FP1n, FP21, FP22, FP23 . . . FP2n, FP31, FP32, FP33 . . . FP3n of the flexible film 200 are arranged to correspond to each other. An alignment mark is a pattern of a specific pattern adjacent to one of the panel pads, which is a pattern that can be used by the alignment image inspecting apparatus to recognize.

When the flexible substrate 110 and the flexible film 200 are adhered by the adhesive layer 300, the panel pad and the film pad may be deformed due to the heat generated in the adhering process. As a result, as shown in FIG. 6A, the panel pads of the flexible substrate 110 and the film pads of the flexible film 200 are misaligned. At this time, the misalignment may be within the tolerance range.

In order to compensate for this, in an aspect of the present disclosure, y-axis correction technique is provided. The y-axis correction value can be calculated by the following equation.

$$\text{y-axis correction value} = A*\text{Tan}(\theta) \quad \text{[Equation 1]}$$

Where, A may be the x-axis difference value between the panel pad and the film pad, θ may be the slope value of the panel pads, and Tan(θ) may be the value of A divided by the reference y-axis.

When the y-axis correction value is calculated by Equation 1, either the flexible substrate 110 or the flexible film 200 is moved in the vertical direction with respect to the center point P to perform y-axis correction.

As illustrated in FIG. 6B, if y-axis correction is performed in this way, an overlapping area of a plurality of panel pads PP11, PP12, PP13 . . . PP1n, PP21, PP22, PP23 . . . PP2n, PP31, PP32, PP33 . . . PP3n of the flexible substrate 110 and a plurality of film pads FP11, FP12, FP13 . . . FP1n, FP21, FP22, FP23 . . . FP2n, FP31, FP32, FP33 . . . FP3n of the flexible film 200, which are misaligned, can be enlarged to minimize misalignment.

Figure 7:
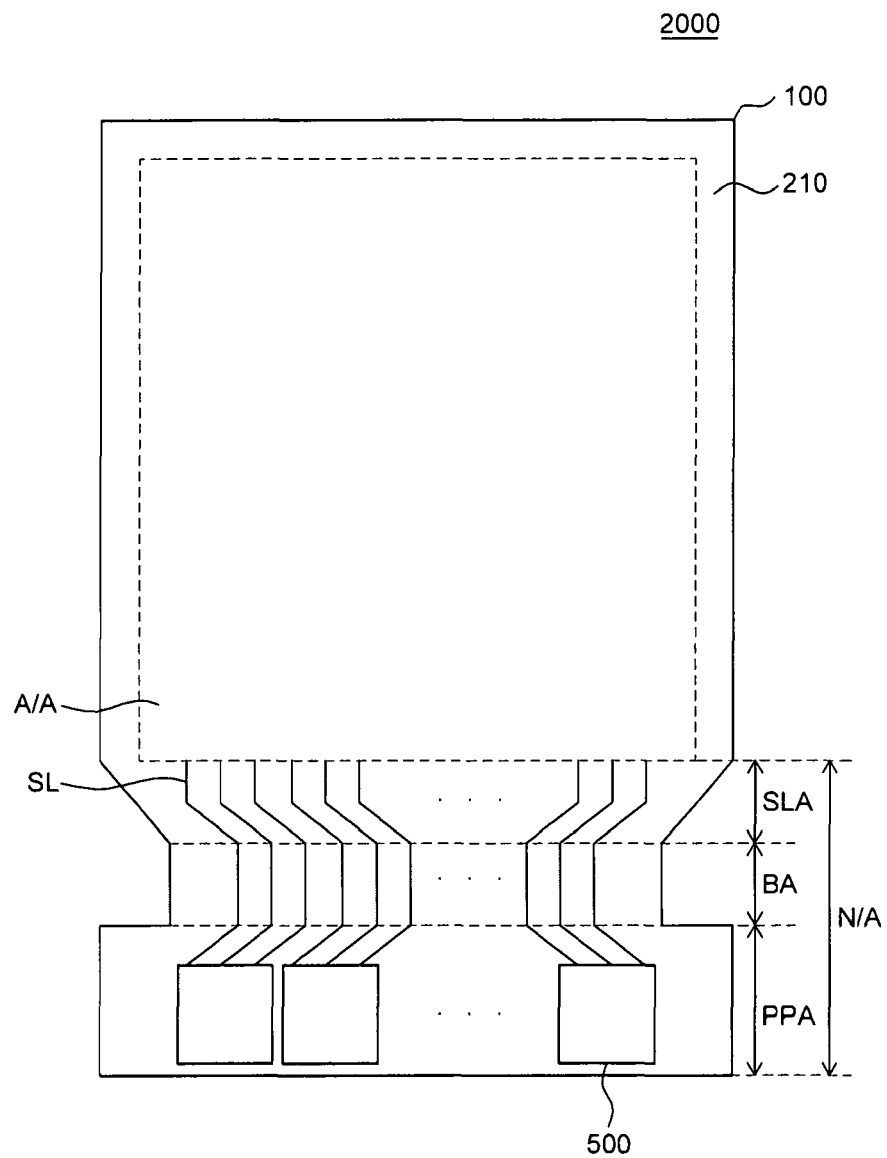
FIG. 7 is a plan view of a flexible display device according to another aspect of the present disclosure.

FIG. 7 is a plan view of a flexible display device according to another aspect of the present disclosure. Referring to FIG. 7, the flexible display device 2000 according to another aspect of the present disclosure may include a flexible substrate 110 and a driver IC 500 disposed on the panel pad area PPA of the flexible substrate 110. As such, a mode in which the driver IC 500 is disposed on the flexible substrate 110 is referred to as chip on plastic (COP). As such, FIG. 7 is similar to FIG. 1 except that the driver IC 500 is disposed on the flexible substrate 110, and the layout of the panel pads is similar to FIG. 1. Thus, detailed descriptions regarding FIG. 7 will be omitted merely for the sake for convenience of explanation. Particularly, when the panel pad area PPA is formed on the flexible substrate 110, a conductive layer for forming the gate line and the data line can be used, which is advantageous in that the thickness of the pad can be reduced.

In some aspects, the shape of the alignment marks can be configured to facilitate y-axis correction. For example, a scale or a specific pattern capable of measuring the degree of y-axis correction of the alignment mark may be provided. However, the present disclosure is not limited thereto.

The exemplary aspects of the present disclosure can also be described as follows:

According to an aspect of the present disclosure, a flexible display device may comprise a flexible display panel including a display area disposed a plurality of pixels, a signal line area disposed a plurality of signal lines for transmitting driving signals to the plurality of pixels, and a panel pad area disposed a plurality of panel pads for receiving the driving signals from an external, and a flexible film configured to transmit the driving signals inputted from an external to the flexible display panel and including a film pad area in which a plurality of film pads arranged so as to correspond to the panel pad, wherein the plurality of film pads has a first thickness configured to increase a contact surface with the flexible display panel.

The first thickness may be a minimum thickness of the plurality of film pads.

The plurality of film pads arranged on the flexible film may be arranged with a plurality of N film pad rows (where N is a natural number of 3 or more).

A plurality of film pads, arranged in a film pad row furthest away from a reference film pad row among the plurality of N film pad rows, may be arranged at intervals of (1/N), and a plurality of film pads, arranged in the film pad row adjacent to the film pad row furthest away from the reference film pad row, may be arranged at intervals of (1/N−1).

The contact surface with the flexible display panel may be configured to be wider as a side slope of a cross section of the plurality of film pads of the flexible film becomes smaller.

The plurality of film pads may be arranged with reference to an arbitrary reference point.

The arbitrary reference point may be disposed in a central area of the film pad area.

A slope angle of each of the plurality of film pads may be increased from the central area to an outer area of the film pad area with reference to the arbitrary reference point.

The plurality of signal lines may be not parallel to each other.

According to an another aspect of the present disclosure, a flexible display device may include a flexible display panel including a display area disposed a plurality of pixels, a signal line area disposed a plurality of signal lines for transmitting driving signals to the plurality of pixels, and a panel pad area disposed a plurality of panel pads for receiving the driving signals from an external, and a flexible film configured to transmit the driving signals inputted from an external to the flexible display panel and including a film pad area in which a plurality of film pads arranged so as to correspond to the panel pad, wherein the plurality of panel pads of the flexible display panel and the plurality of film pads of the flexible film may be arranged in a fan shape, wherein the plurality of panel pads of the flexible display panel and the plurality of film pads of the flexible film may be arranged to correspond to each other, and wherein the plurality of panel pads of the flexible display panel and the plurality of film pads of the flexible film may be arranged so as to have different pitches and different slopes from each other.

Slopes of the plurality of panel pads of the flexible display panel in a fan-shape and slopes of the plurality of film pads of the flexible film may be converged at the same point.

The plurality of panel pads of the flexible display panel and the plurality of film pads of the flexible film may have a larger area overlapping each other by y-axis correction.

The plurality of panel pads in the fan-shape may be implemented corresponding to a size of a driver IC and a size of the panel pad area where the plurality of panel pads of the flexible display panel are arranged.

A plurality of panel pad rows including a first panel pad row, a second panel pad row and a third panel pad row may be arranged in the panel pad area of the display panel, a first pad of the second panel pad row may be disposed at a half point between a first pad and a second pad of the first panel pad row, and a first pad of the third panel pad row may be disposed at one third point between the first pad and the second pad of the first panel pad row.

A pitch between the plurality of panel pads arranged in the first panel pad row, a pitch between the plurality of panel pads arranged in the second panel pad row, and a pitch between the plurality of panel pads arranged in the third panel pad row may be different from each other.

The flexible display panel further may include a bending area and the bending area may be narrower than the display area and the panel pad area.

An alignment mark may be arranged in the panel pad area of the flexible display panel and the film pad area of the flexible film, and a shape of the alignment mark may be selected among a scale pattern or a specific pattern for measuring a degree of y-axis correction.

Although the aspects of the present disclosure have been described in detail with reference to the accompanying drawings, it is to be understood that the present disclosure is not limited to those described aspects and various changes and modifications may be made without departing from the scope of the present disclosure. Therefore, the aspects disclosed in the present disclosure are not intended to limit the technical scope of the present disclosure, but to illustrate them. Thus, the technical scope of the present disclosure is not limited by these aspects. It should be understood that the above-described aspects are merely illustrative in all aspects and not restrictive. The scope of the present disclosure should be construed only by the appended claims, and all technical features within the scope of equivalents should be construed as being included in the scope of the present disclosure.

What is claimed is:

1. A flexible display device comprising:
    a flexible display panel including a flexible substrate and back plates, the flexible substrate including a display area, a signal line area, a panel pad area and a bending area between the signal line area and the panel pad area;
    a plurality of pixels disposed at the display area of the flexible substrate;
    a plurality of signal lines disposed at the signal line area of the flexible substrate and extending to the panel pad area of the flexible substrate for transmitting driving signals to the plurality of pixels;
    a plurality of panel pads disposed at the panel pad area of the flexible substrate for receiving the driving signals from outside,
    wherein the back plates includes a first back plate disposed under the flexible substrate corresponding to the display area and the signal line area of the flexible substrate and a second back plate disposed under the flexible substrate corresponding to the panel pad area of the flexible substrate, and
    wherein the second back plate is disposed under the first back plate to face the first back plate; and
    a flexible film transmitting the driving signals inputted from the outside to the flexible display panel and including a film pad area in which a plurality of film pads corresponds to the plurality of panel pad,
    wherein the plurality of panel pads of the flexible display panel and the plurality of film pads of the flexible film are arranged to correspond to each other in a fan shape and have different pitches and slopes from each other.

2. The flexible display device of claim 1, wherein slopes of the plurality of panel pads of the flexible display panel in a fan-shape and slopes of the plurality of film pads of the flexible film are converged at a same point.

3. The flexible display device of claim 2, wherein an overlapping area between the plurality of panel pads of the flexible display panel and the plurality of film pads of the flexible film increases by y-axis correction.

4. The flexible display device of claim 2, wherein the plurality of panel pads corresponds to a size of a driver IC and a size of the panel pad area.

5. The flexible display device of claim 1, wherein the plurality of panel pad rows includes a first panel pad row, a second panel pad row and a third panel pad row and is arranged in the panel pad area,
    wherein a first pad of the second panel pad row is disposed at a half point between a first pad and a second pad of the first panel pad row, and a first pad of the third panel pad row is disposed at one-third point between the first pad and the second pad of the first panel pad row.

6. The flexible display device of claim 5, wherein a pitch between the plurality of panel pads arranged in the first panel pad row, a pitch between the plurality of panel pads arranged in the second panel pad row, and a pitch between the plurality of panel pads arranged in the third panel pad row are different from one another.

7. The flexible display device of claim 1, wherein the bending area is narrower than the display area and the panel pad area.

8. The flexible display device of claim 1, wherein the panel pad area and the film pad area have an alignment mark including a scale pattern or a specific pattern for measuring a degree of y-axis correction.

* * * * *